United States Patent
Tsuchitani et al.

(10) Patent No.: US 6,239,464 B1
(45) Date of Patent: May 29, 2001

(54) SEMICONDUCTOR GATE TRENCH WITH COVERED OPEN ENDS

(75) Inventors: Masanobu Tsuchitani, Fuchu; Keita Suzuki, Nishinomiya; Akihiko Osawa, Kawasaki; Yoshiro Baba, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/226,720

(22) Filed: Jan. 7, 1999

(30) Foreign Application Priority Data

Jan. 8, 1998 (JP) .................................................. 10-002608

(51) Int. Cl.⁷ .......................... H01L 29/792; H01L 29/76; H01L 29/94; H01L 31/062; H01L 31/113
(52) U.S. Cl. .......................... 257/330; 257/329; 257/332; 257/333; 257/334
(58) Field of Search .................................. 257/329, 330, 257/333, 334, 332

(56) References Cited

U.S. PATENT DOCUMENTS

| | | | |
|---|---|---|---|
| 4,964,080 | * 10/1990 | Tzeng | 365/185 |
| 5,378,655 | * 1/1995 | Hutchings et al. | 437/203 |
| 5,541,425 | 7/1996 | Nishihara . | |
| 5,610,422 | 3/1997 | Yanagiya et al. . | |
| 5,793,082 | * 8/1998 | Bryant | 257/330 |
| 6,020,600 | * 2/2000 | Miyajima et al. | 257/76 |
| 6,057,558 | * 5/2000 | Yamamoto et al. | 257/77 |

FOREIGN PATENT DOCUMENTS

| | | |
|---|---|---|
| 002085656 | * 4/1982 | (GB) .................................. 257/330 |
| 2-113548 | 4/1990 | (JP) . |
| 5-47919 | 2/1993 | (JP) . |
| 7-249768 | 9/1995 | (JP) . |
| 7-326738 | 12/1995 | (JP) . |

* cited by examiner

Primary Examiner—Eddie C. Lee
Assistant Examiner—Jesse A Fenty
(74) Attorney, Agent, or Firm—Finnegan, Henderson, Farabow, Garrett & Dunner, L.L.P.

(57) ABSTRACT

A semiconductor device, which can have a uniform film on open ends of trenches by using materials having a different oxidation rate, and a fabrication method thereof are provided. The semiconductor device having trenches configured to have open ends covered with an oxidation film made of a material having an oxidation rate faster than that of a semiconductor substrate and a fabrication method thereof are provided.

3 Claims, 10 Drawing Sheets

PRIOR ART

PRIOR ART

SEMICONDUCTOR GATE TRENCH WITH COVERED OPEN ENDS

BACKGROUND OF THE INVENTION

1. Field of the Invention

The present invention relates to a trench-gate type semiconductor device and a fabrication method thereof, and more particularly to a transistor, which has open ends of trenches made of materials having a different oxidation rate, and a fabrication method thereof.

2. Description of the Related Art

A high integrated circuit, which has semiconductor devices such as transistors highly integrated by a micromachining technology, is demanded to be more densely integrated and have high driving performance.

In recent years, a semiconductor device having trenches (grooves) is particularly attracting attention. By forming gates so to have a trench configuration, an area occupied by the gates on a substrate can be decreased, resulting in achieving a high integrated circuit which has a high current value and high performance.

However, such a trench configuration has a drawback that a gate oxidation film on the open ends of the trenches is thinner than the other portion of the gate oxidation film. This is because the film grows differently in parts depending on its orientation during the thermal oxidation of the film. In a process for manufacturing a transistor, the oxidation of the gates requires a temperature of about 1000° C. Therefore, the gate oxidization film of the open ends becomes thin. When the gate oxidation film on the open ends of the trenches is thinner than the gate oxidization film on the other portion, it may be broken due to a high electric field generated on the open ends.

Where the oxidation is made at a temperature higher than 1000° C., the gate oxidation film is uniformly formed including the open ends of the trenches. But, the oxidation at a temperature higher than 1000° C. involves a disadvantage that impurities are excessively dispersed in an impurity dispersion layer.

A semiconductor device having a conventional trench configuration and a fabrication method thereof will be described with reference to FIG. 9 through FIG. 13.

FIG. 9 is a plan diagram showing a conventional semiconductor device comprising a gate electrode extension section 11, a source 3 and trenches 7. FIG. 10 is a sectional diagram taken along line A–A' of FIG. 9, and FIG. 11 is a sectional diagram taken along line B–B' of FIG. 1. They show a semiconductor substrate (drain) 1, a base 2, a gate film 8 and a gate electrode 10 as well as the gate electrode extension section 11 and the source 3.

FIGS. 12A to 12D show a process for fabricating a conventional trench-gate type semiconductor device. FIG. 12A is a diagram showing that the base 2, the source 3 and a thermal oxidation film 4 are formed on the silicon substrate (drain) 1. FIG. 12B shows that a trench masking material 6 is formed on the thermal oxidation film 4 to etch trenches. FIG. 12C shows a state that the trenches 7 are formed in the semiconductor substrate by etching, and the thermal oxidation film 4 and the masking material 6 are removed. FIG. 12D shows that a gate film 8 is formed to cover the trenches 7, the base 2 and the source 3, and the gate electrode 10 is formed on the gate film.

FIG. 13 is an enlarged sectional diagram showing a trench configuration of a conventional semiconductor device. It is seen from FIG. 13 that the gate film is thin as if it was notched at both ends of the open surface of the trench. An electric field tends to concentrate on the notched portions 12 where the gate film is thin, resulting in degrading a withstand pressure of the gate.

In order to remedy the above-described disadvantage involved in the trench configuration, a variety of attempts are being made.

For example, Japanese Patent Laid-Open Application No. Hei 7-249768 discloses a semiconductor device having the thickened upper end corners of trench side walls by oxidizing increasingly. Japanese Patent Laid-Open Application No. Hei 5-47919 discloses a semiconductor device which is formed to have round edges on trenches where elements are formed. Japanese Patent Laid-Open Application No. Hei 7-326738 discloses a configuration that the upper corners of trenches are not covered with the gate electrode. Japanese Patent Laid-Open Application No. Hei 2-113548 discloses a configuration that stepped sections are formed just below the gate electrode, and an oxidation film is formed on side walls of the stepped sections.

The manufacturing processes in connection with such publications, however, were complex and poor in fabricating the notched parts of the gate film with a satisfactory thickness.

Thus, there are demands for a semiconductor device having a configuration that a notched part is not caused in the gate film on the open ends of the trenches.

In view of the circumstances described above, an object of the invention is to provide a semiconductor device which has a film with a uniform thickness even on the open ends of trenches without causing a notched part by using materials having a different oxidation rate, and a fabrication method thereof.

Another object of the invention is to provide a semiconductor device having trenches with more reliable open ends by filling impurities into a material having a fast oxidation rate among other material having a different oxidation rate in order to further differentiate its oxidation rate from the other materials and a fabrication method thereof.

SUMMARY OF THE INVENTION

A semiconductor device of the present invention comprises a semiconductor substrate; a dispersion layer formed on the semiconductor substrate; an insulation film formed on the dispersion layer; a layer which is formed on the insulation film and has an oxidation rate faster than the semiconductor substrate and the dispersion layer; trenches formed to pierce in the semiconductor substrate, the dispersion layer, the insulation film and the layer having a fast oxidation rate; and an oxidation film formed to cover the trenches, wherein the trenches have their open ends covered with an oxidation film which is formed by oxidizing the layer having the fast oxidation rate.

A method for fabricating a semiconductor device according to the present invention comprises the steps of forming a dispersion layer on a semiconductor substrate; forming an insulation film on the dispersion layer; forming on the insulation film a layer having an oxidation rate faster than the semiconductor substrate and the dispersion layer; forming trenches to pierce in the semiconductor substrate, the dispersion layer, the insulation film and the layer having a fast oxidation rate; forming an oxidation film on the trenches and concurrently forming an oxidation film covering open ends of the trenches by oxidizing the layer having the fast oxidation rate; and forming an electrode on the both oxidation films.

According to the present invention, the layer having the fast oxidation rate is substantially made of polysilicon and impurities may be added to the polysilicon. Moreover, according to the present invention, the layer having the fast oxidation rate has typically a thickness of not less than 100 nm, although the thickness changes depending on the thickness of the gate oxidation film.

Another method for fabricating a semiconductor device, comprises the steps of forming a polysilicon layer on a first region of a semiconductor substrate; adding impurities to the first region where the polysilicon layer is formed and a second region on the semiconductor substrate to form a dispersion layer on the second region; forming an insulation film on the polysilicon layer and the dispersion layer; forming trenches to pierce in the semiconductor substrate, the polysilicon layer, the dispersion layer and the insulation film; concurrently oxidizing the polysilicon layer and the trenches to form an oxidation film covering open ends of the trenches; and forming an electrode on the both oxidation films.

In the semiconductor device and the fabrication method thereof according to the invention, the dispersion layer comprises a base layer and a source layer.

Also, in the semiconductor device and the fabrication method thereof, the insulation film covers substantially the entirety of the layer having a fast oxidation rate and the trenches continuously.

According to one embodiment of the invention, the semiconductor substrate is typically silicon, and a material having an oxidation rate faster than the semiconductor substrate and the dispersion layer is typically polysilicon. Impurities may be added to the polysilicon.

According to the invention, the presence of the material having an oxidation rate faster than the semiconductor substrate and the dispersion layer on the semiconductor substrate allows to have bulky open ends of the trenches and prevents the insulation film on the ends from thinning as in the related art.

According to the present invention, after etching the substrate, oxidation of the trenches (grooves) forms an $SiO_2$ film on the substrate and the dispersion layer in the trenches, and a polysilicon oxidation film on the polysilicon and the polysilicon inside trenches. The bulky laminated configuration can be achieved because the polysilicon has an oxidation rate faster than the silicon. Another material other than polysilicon can be used if its oxidation rate is faster than silicon. For example, amorphous silicon or the like can be used.

Specifically, the substrate and an oxidation film material having an oxidation rate faster than a material of the substrate can be combined to achieve the trench configuration having a thick open end, and such combination is not limited to a particular one.

Generally, the oxidation rate becomes faster with the increase of the material concentration. Accordingly, the oxidation rate can be enhanced by adding impurities.

Addition of impurities increases the layer thickness by dozens nm as compared with no addition of such impurities.

Examples of impurities include normally used impurities such as boron (B) for a p-type semiconductor and arsenic (As), antimony (Sb), phosphorus (P) or the like for an n-type semiconductor. Addition of impurities can make the open ends of trenches bulky with high precision. An implantation amount of the impurities is about $10^{20} cm^{-3}$.

$SiO_2$, which is generally used as a masking material, is also a material for the thermal oxidation film (insulation film), which is therefore partly removed when the masking material is removed.

However, the semiconductor device according to the invention has an additional layer on the thermal oxidation film to provide an effect that a thickness of the thermal oxidation film is prevented from being degraded owing to the removal of the masking material. Thus, the thermal oxidation film can be used to profit a thickness of the insulation film on the trench openings.

The configuration and the fabrication method of the present invention can be applied to any semiconductor device having trenches without any other limitation. For example, only one side may be drawn like a conventional one as shown in FIG. 8. The invention is applied not only to MOS-FET (Metal Oxide Semiconductor-Field Effect Transistor) but to IGBT (Insulated Gate Bipolar Transistor) by using an n-type semiconductor substrate which has a p-type layer formed on the entire back face of the semiconductor substrate.

According to the present invention, the open ends of the trenches can be made bulky and the film thickness on the open ends can be prevented from becoming thinner than the other part of the film by using materials having a different oxidation rate. Thus, a gate tolerance dose can be prevented from being lowered, and a semiconductor device having excellent performance can be realized. Dispersion of impurities into polysilicon can make the polysilicon oxidation film thick and additionally improve a margin of the gate tolerance dose.

DESCRIPTION OF THE PREFERRED EMBODIMENTS

Embodiment 1

A MOS type semiconductor device of the invention will be described with reference to FIG. 1, FIGS. 2A to 2D, FIG. 3 and FIGS. 4A to 4G.

Figure 1:
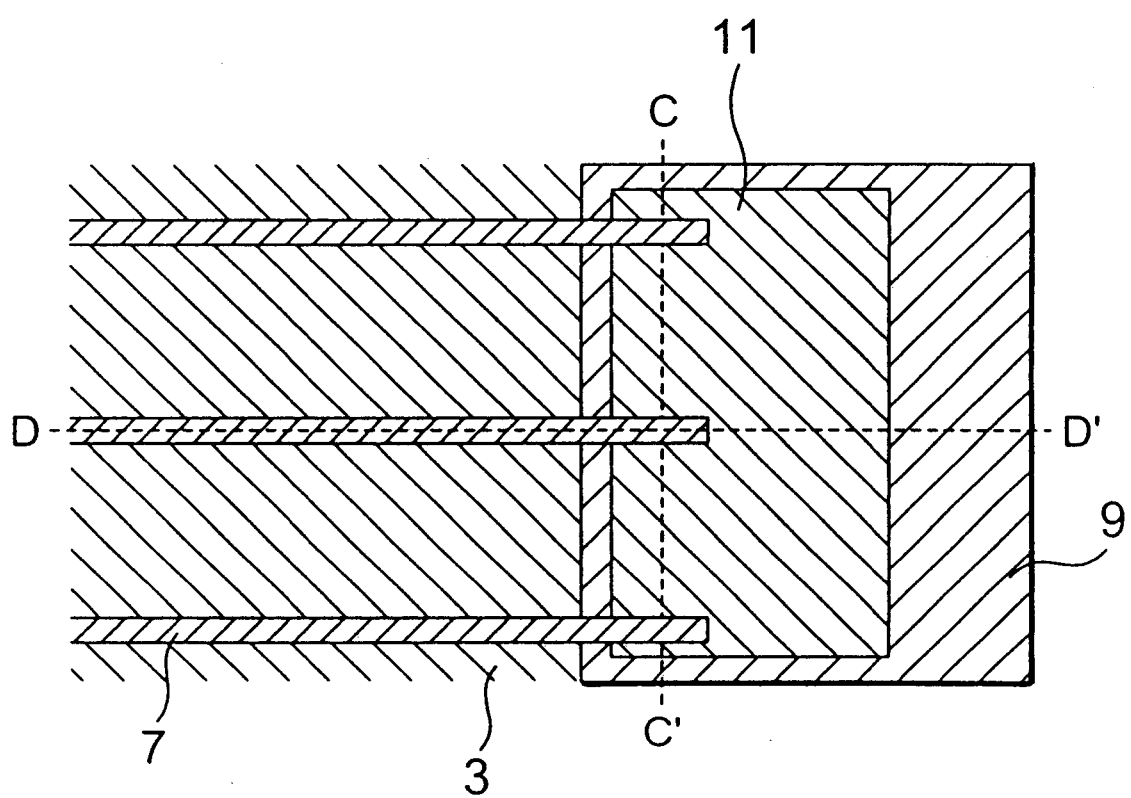
FIG. 1 is a plan diagram of a semiconductor device according to an embodiment of the invention.

FIG. 1 is a plan diagram of a semiconductor of the invention, which comprises a gate electrode extension section 11, a polysilicon oxidation film 9, trenches 7 and a source 3.

Figure 2A:
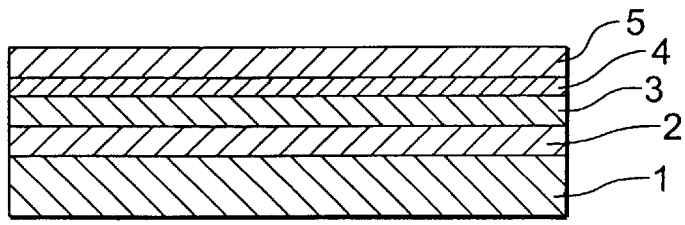
FIG. 2A is a sectional diagram taken along line C–C' of FIG. 1 to show a fabricating step of a semiconductor device according to an embodiment of the invention.
Figure 2B:
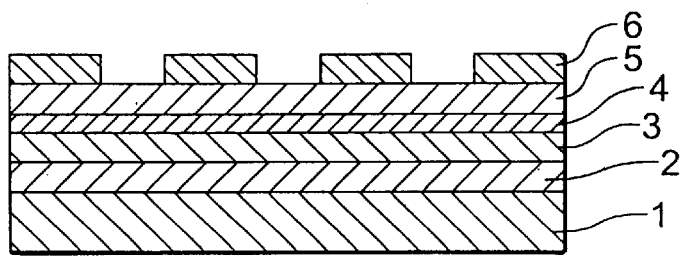
FIG. 2B is a sectional diagram taken along line C–C' of FIG. 1 to show a fabricating step of the semiconductor device according to the embodiment of the invention.
Figure 2C:
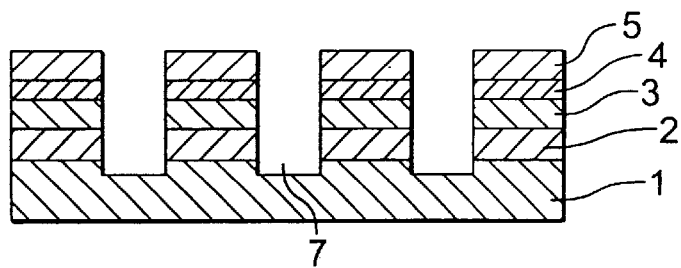
FIG. 2C is a sectional diagram taken along line C–C' of FIG. 1 to show a fabricating step of the semiconductor device according to the embodiment of the invention.
Figure 2D:
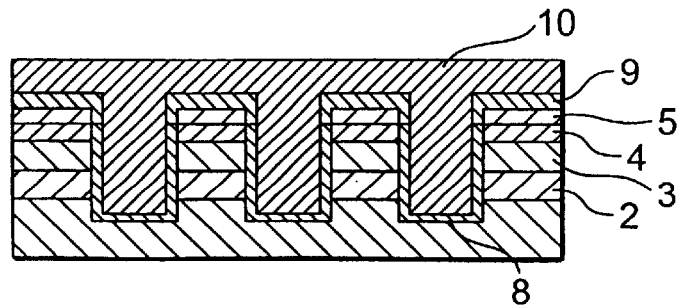
FIG. 2D is a sectional diagram taken along line C–C' of FIG. 1 to show a fabricating step of the semiconductor device according to the embodiment of the invention.

FIG. 2A shows that a base 2, the source 3, a thermal oxidation film 4 and polysilicon 5 are formed on a semiconductor substrate (drain) 1. FIG. 2B shows that a trench masking material 6 for trench etching is formed on the polysilicon 5. FIG. 2C shows a state that the trenches 7 are formed on the semiconductor substrate by etching and the masking material 6 is removed. FIG. 2D shows that the polysilicon oxidation film 9 is formed on the polysilicon 5 and open ends of trenches 7, a gate film 8 is formed in the trenches 7 and a gate electrode 10 is also embedded in them.

Figure 3:
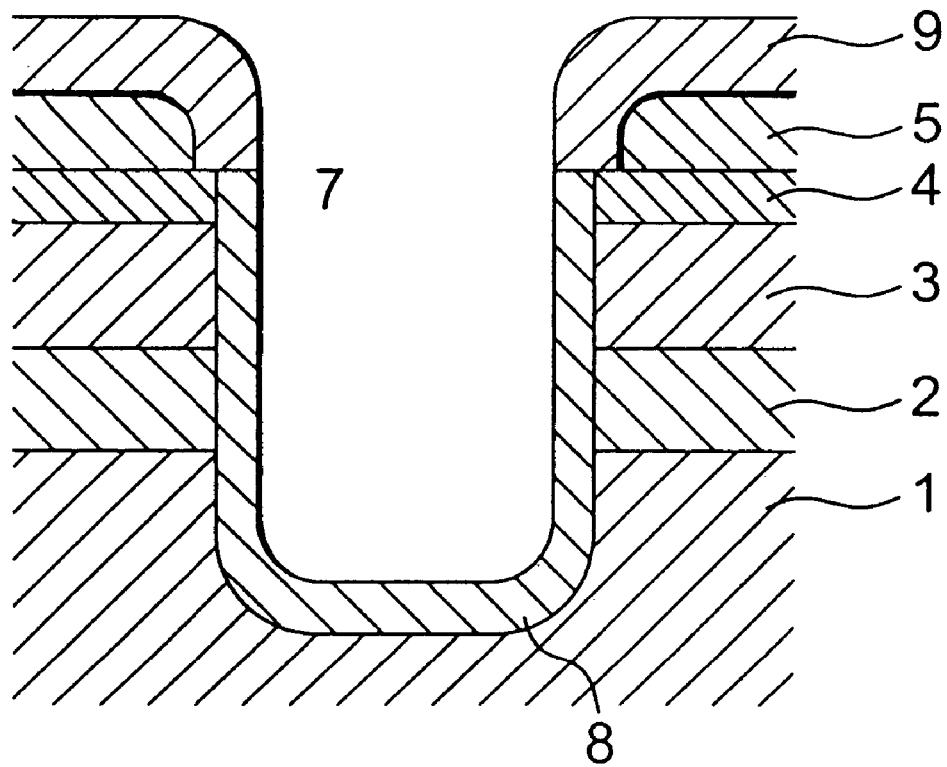
FIG. 3 is an enlarged sectional diagram of a trench in the semiconductor device of the invention.

FIG. 3 is an enlarged sectional diagram to show a configuration of the trench of the semiconductor device of the invention. It is seen from FIG. 3 that the polysilicon 5 and the polysilicon oxidation film 9 are additionally laminated on the gate film 8 and the thermal oxidation film 4. Thus, both ends of the open surface of the trench does not become thin and do not have a notched shape.

The gate film 8 has a thickness of about 100 nm, the thermal oxidation film 4 has a thickness of 100 to 200 nm, polysilicon has a thickness of not less than 500 nm, and the polysilicon oxidation film 9 has a thickness of not less than 100 nm.

Embodiment 2

A method for fabricating the MOS type semiconductor device of the invention will be described specifically with reference to FIGS. 2A to 2D that are sectional diagrams taken along line C–C' of FIG. 1.

First, as shown in FIG. 2A, the silicon semiconductor substrate (drain) 1 is deposited a $p^+$-type base diffusion layer 2 having a depth of 4000 nm, an $n^+$-type source diffusion layer 3 having a depth of 300 nm, a $SiO_2$ thermal oxidation film 4 having a thickness of 150 nm as an insulation film, and polysilicon 5 having a thickness of 500 nm as a material having an oxidation rate faster than the silicon substrate and both the diffusion layers by, for example, a CVD method.

The $SiO_2$ trench masking material 6 for trench etching is then formed on the polysilicon 5 by the CVD method as shown in FIG. 2B.

The $SiO_2$ trench masking material 6 is patterned and the polysilicon 5 and the $SiO_2$ thermal oxidation film 4 are etched by reactive ion etching or the like to form the trenches 7 as shown in FIG. 2C. The trenches have a width of about 1,000 nm and a depth of about 4,000 to 6,000 nm. After post-processing the trenches 7, the masking material 6 is removed.

Then, oxidizing treatment is applied to form the gate film 8 having a thickness of 100 nm on the trenches 7 and to oxidize the surface of the polysilicon 5 to form the polysilicon oxidation film 9 having a thickness of 150 nm thereon as shown in FIG. 2D. The oxidation rate of the polysilicon is faster than bulk silicon of the base 2 and the source 3, resulting in the laminated configuration as described above. The gate electrode 10 is formed on the gate film 8 and the polysilicon oxidation film 9, and the gate electrode extension section 11 is patterned.

A CVD layer is then formed on the entire surface of the element (not shown). The CVD layer is etched by lithography to form openings for providing contact, source electrodes are made using Al metal or the like, and a passivation layer is then formed to configure a transistor.

Embodiment 3

A MOS type semiconductor device having impurities filled according to a modified embodiment of the invention will be described with reference to FIGS. 4A to 4G and FIGS. 5A to 5H.

Figure 4A:
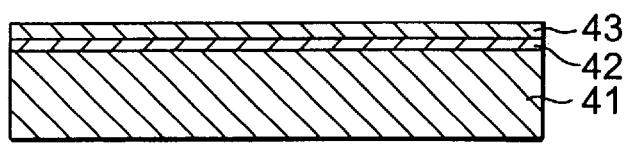
FIG. 4A is a sectional diagram taken along line C–C' of FIG. 1 to show a fabricating step of a semiconductor device according to another embodiment of the invention.
Figure 4B:
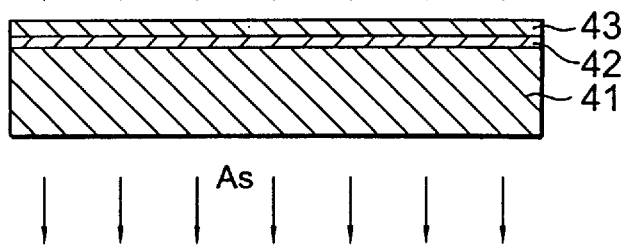
FIG. 4B is a sectional diagram taken along line C–C' of FIG. 1 to show a fabricating step of the semiconductor device according to the above embodiment of the invention.
Figure 4C:
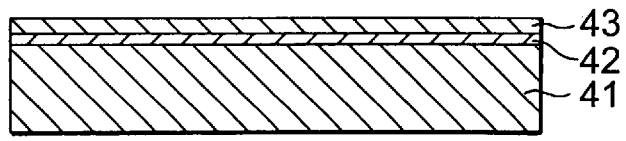
FIG. 4C is a sectional diagram taken along line C–C' of FIG. 1 to show a fabricating step of the semiconductor device according to the above embodiment of the invention.

FIG. 4A shows that an SiO$_2$ thermal oxidation film 42 is formed in a thickness of 150 nm on a silicon semiconductor substrate 41, and polysilicon 43 is additionally formed in a thickness of 500 nm thereon. FIG. 4B shows that boron is implanted into the surface of the polysilicon 43, and arsenic is then implanted as shown in FIG. 4C.

Figure 4D:
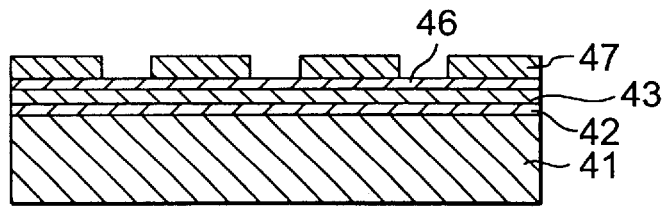
FIG. 4D is a sectional diagram taken along line C–C' of FIG. 1 to show a fabricating step of the semiconductor device according to the above embodiment of the invention.
Figure 4E:
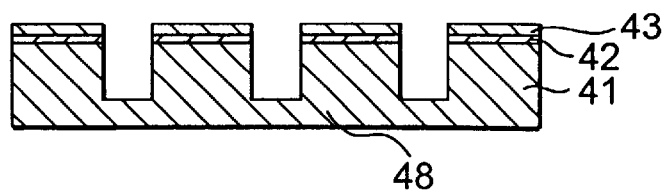
FIG. 4E is a sectional diagram taken along line C–C' of FIG. 1 to show a fabricating step of the semiconductor device according to the above embodiment of the invention.

FIG. 4D shows that a trench masking material 47 for trench etching is formed by a CVD method on an oxidation film 46 which is formed on the polysilicon 43 by diffusing the impurities. The trench masking material 47 is patterned and the oxidation film 46 and the polysilicon 47 are etched by reactive ion etching (RIE) or the like to form trenches 48 as shown in FIG. 4E. After post-treatment of the trenches, the masking material 47 is removed.

Figure 4F:
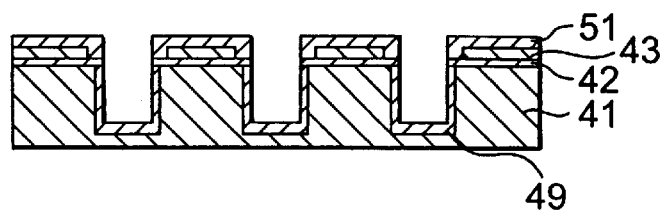
FIG. 4F is a sectional diagram taken along line C–C' of FIG. 1 to show a fabricating step of the semiconductor device according to the above embodiment of the invention.
Figure 4G:
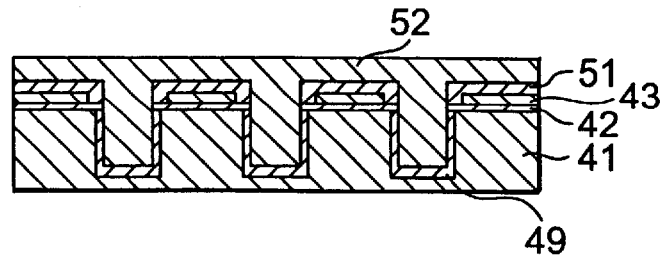
FIG. 4G is a sectional diagram taken along line C–C' of FIG. 1 to show a fabricating step of the semiconductor device according to the above embodiment of the invention.

FIG. 4F shows that oxidation treatment is applied to form a gate oxidation film 49 in the trenches 48, and a polysilicon oxidation film 51 on the surface of the polysilicon 43. Utilizing the oxidation rate of the polysilicon faster than that of the bulk silicon of the substrate, the open ends of the trenches are reinforced with the thick polysilicon oxidation film. FIG. 4G shows that a gate electrode 52 is then formed on the entire surface.

Figure 5A:
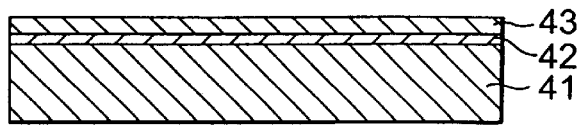
FIG. 5A is a sectional diagram taken along line D–D' of FIG. 1 to show a fabricating step of a semiconductor device according to another embodiment of the invention.

FIGS. 5A to 5H are sectional diagrams taken along line D–D' of FIG. 1. FIGS. 5A and B correspond to FIG. 4A, FIG. 5C corresponds to FIG. 4B, FIG. 5D corresponds to FIG. 4C, FIG. 5E corresponds to FIG. 4D, FIG. 5F corresponds to FIG. 4E, FIG. 5G corresponds to FIG. 4F, FIG. 5H corresponds to FIG. 4G, respectively.

Figure 5B:
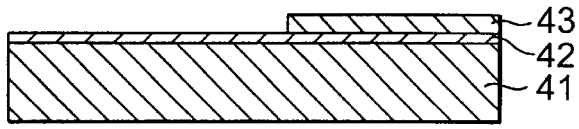
FIG. 5B is a sectional diagram taken along line D–D' of FIG. 1 to show a fabricating step of the semiconductor device according to the above embodiment of the invention.

FIG. 5A shows that an SiO$_2$ thermal oxidation film 42 is formed in a thickness of 150 nm on a silicon semiconductor substrate 41, and polysilicon 43 is additionally formed in a thickness of 500 nm thereon. FIG. 5B shows that the polysilicon 43 is patterned so to remain the polysilicon 43 on the gate electrode extension area before implanting the impurities.

Figure 5C:
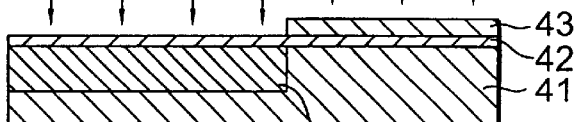
FIG. 5C is a sectional diagram taken along line D–D' of FIG. 1 to show a fabricating step of the semiconductor device according to the above embodiment of the invention.

FIG. 5C shows that boron is implanted to disperse in the surface of the silicon substrate 41 where the SiO$_2$ thermal exidation film 42 thereof to form a base layer 44. Boron is also dispersed in the polysilicon layer 43.

Figure 5D:
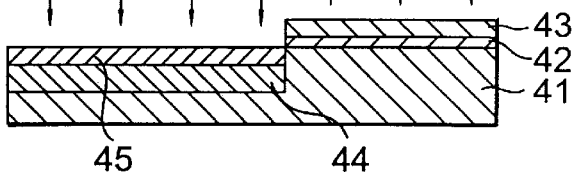
FIG. 5D is a sectional diagram taken along line D–D' of FIG. 1 to show a fabricating step of the semiconductor device according to the above embodiment of the invention.

FIG. 5D shows that the SiO$_2$ thermal oxidation film 42 is selectively etched, and arsenic is implanted and dispersed in the base layer 44 to form a source layer 45. In FIGS. 5C and 5D, boron and arsenic are implanted as impurities in the polysilicon 43. Alternatively, only arsenic may be implanted.

Figure 5E:
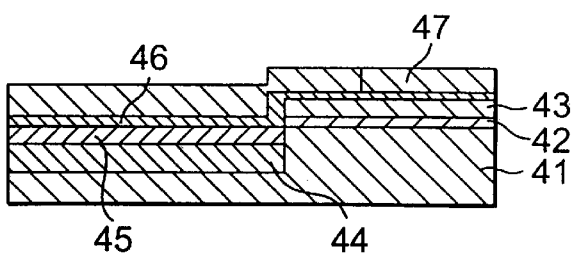
FIG. 5E is a sectional diagram taken along line D–D' of FIG. 1 to show a fabricating step of the semiconductor device according to the above embodiment of the invention.

FIG. 5E shows that the trench masking material 47 for trench etching is formed by the CVD method on the oxidation film 46 formed on the polysilicon 43 formed by diffusing the impurities, as in FIG. 4D.

Figure 5F:
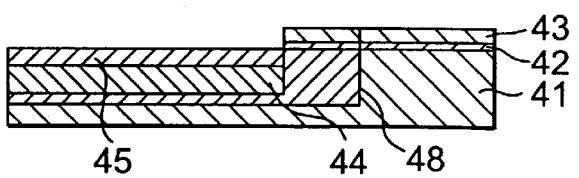
FIG. 5F is a sectional diagram taken along line D–D' of FIG. 1 to show a fabricating step of the semiconductor device according to the above embodiment of the invention.

FIG. 5F shows that the trench masking material 47 is patterned, the oxidation film 46 and the polysilicon 47 are etched to form trenches 48 by reactive ion etching (RIE) or the like as in FIG. 4E. After post-treating the trenches, the masking material 47 is removed.

Figure 5G:
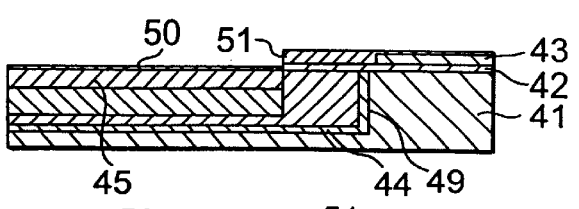
FIG. 5G is a sectional diagram taken along line D–D' of FIG. 1 to show a fabricating step of the semiconductor device according to the above embodiment of the invention.

FIG. 5G shows that oxidation treatment is applied to form the gate oxidation film 49 in the trenches 48, and the polysilicon oxidation film 51 on the surface of the polysilicon 43 as in FIG. 4F. Utilizing the oxidation rate of the polysilicon faster than that of the bulk silicon of the substrate, the open ends of the trenches are reinforced with the thick polysilicon oxidation film.

Figure 5H:
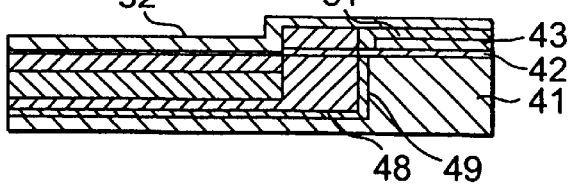
FIG. 5H is a sectional diagram taken along line D–D' of FIG. 1 to show a fabricating step of the semiconductor device according to the above embodiment of the invention.

FIG. 5H shows that the gate electrode 52 is formed on the entire surface as in FIG. 4G.

The semiconductor devices of Embodiments 2 and 3, and the conventional semiconductor device were measured for a gate tolerance dose. A voltage was applied so to have 100 $\mu$A/cm$^2$, and the gate film thickness was standardized to measure.

Figure 6:
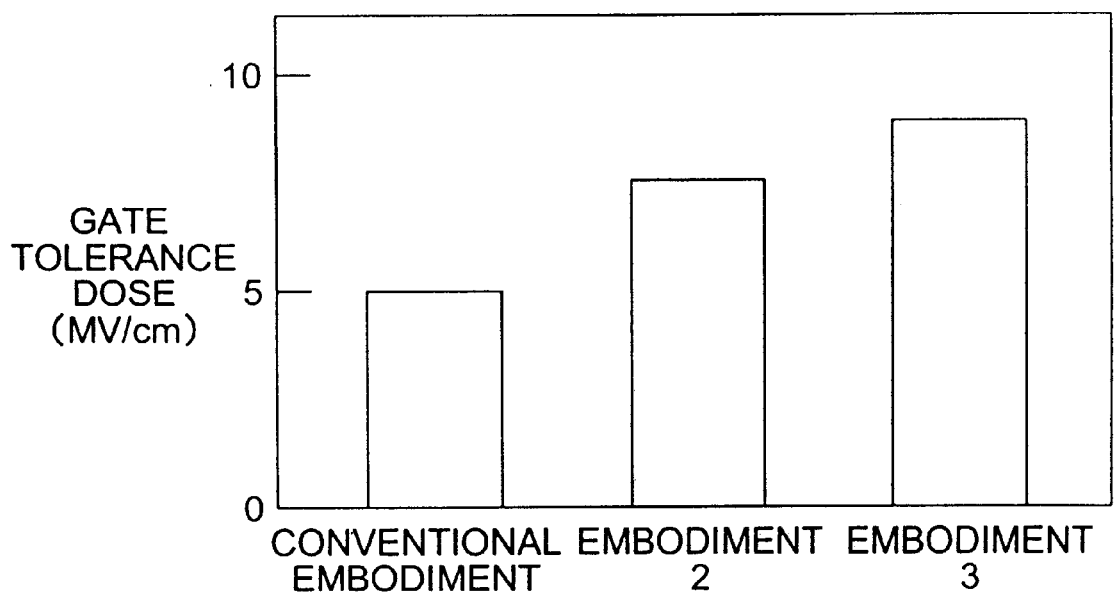
FIG. 6 is a graph showing a gate tolerance dose compared between a conventional semiconductor device and the semiconductor devices according to the invention.

It is apparent from a graph in FIG. 6 that the semiconductor devices of Embodiments 2 and 3 had a gate tolerance does increased by 45% and 63% respectively as compared with the conventional semiconductor device.

Embodiments 4 and 5

Figure 7A:
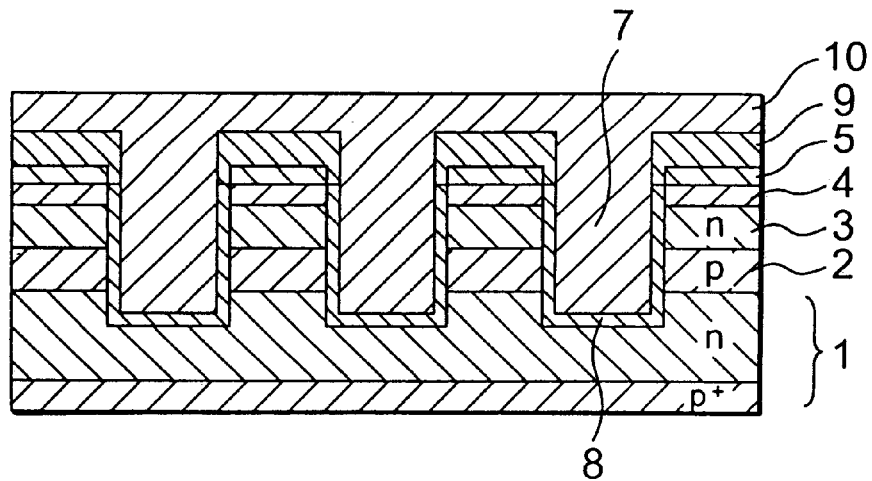
FIG. 7A is a sectional diagram of an IGBT type semiconductor device of an embodiment of the invention.
Figure 7B:
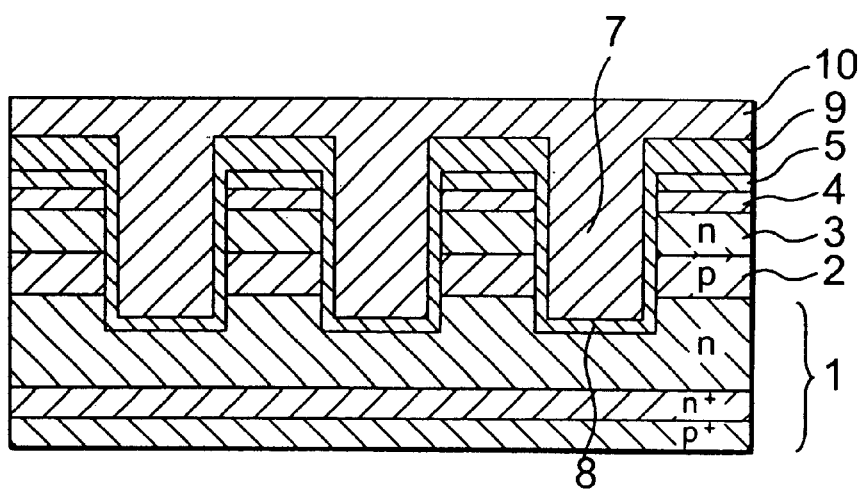
FIG. 7B is a sectional diagram of an IGBT type semiconductor device of another embodiment of the invention.
Figure 8:
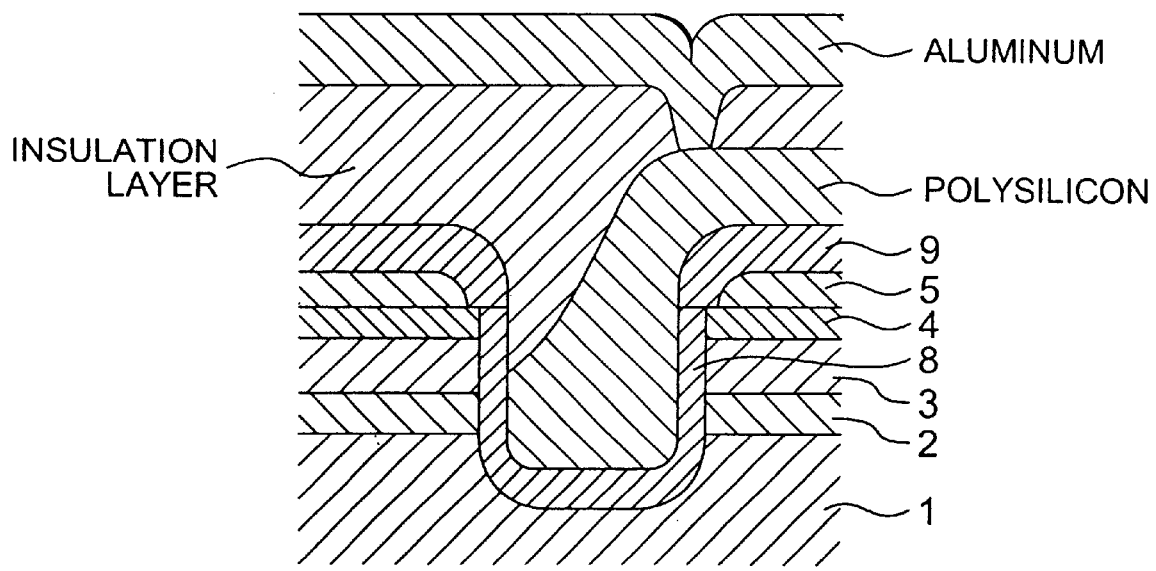
FIG. 8 is an enlarged sectional diagram of a trench of a semiconductor device according to a modified embodiment of the invention.
Figure 9:
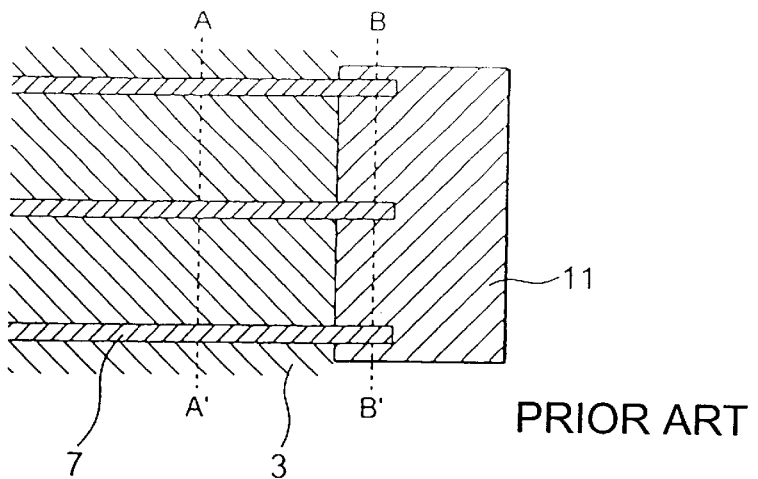
FIG. 9 is a plan diagram of a conventional semiconductor device.
Figure 10:
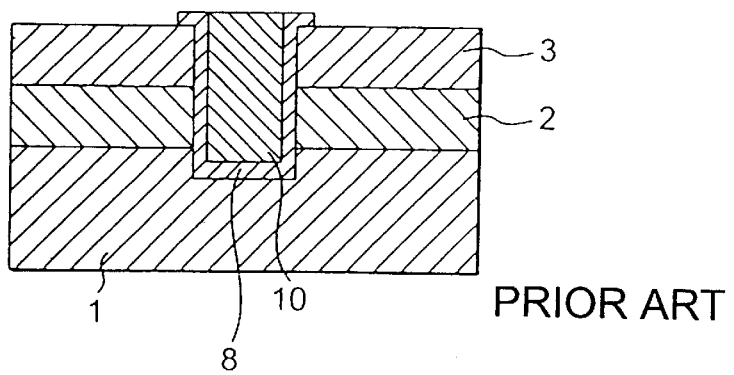
FIG. 10 is a sectional diagram taken along line A–A' of FIG. 9.
Figure 11:
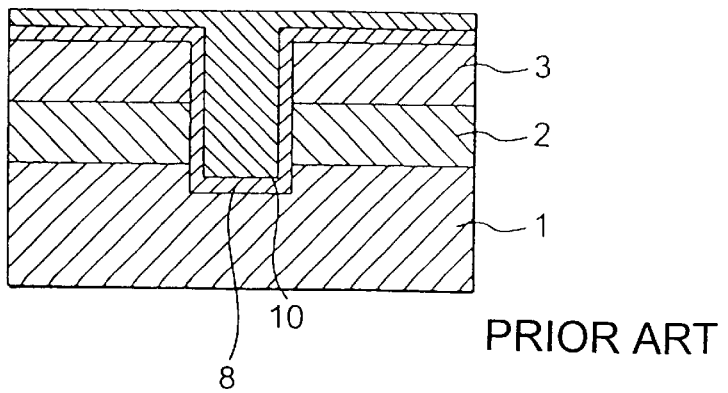
FIG. 11 is a sectional diagram taken along line B–B' of FIG. 9.
Figure 12A:
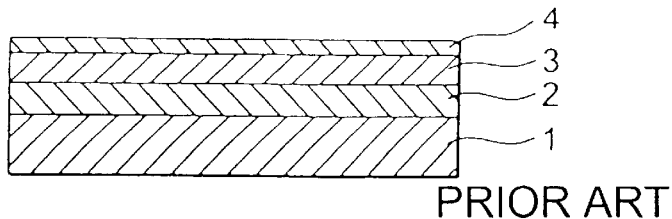
FIG. 12A is a sectional diagram taken along line B–B' of FIG. 9 to show fabricating steps for a conventional semiconductor device.
Figure 12B:
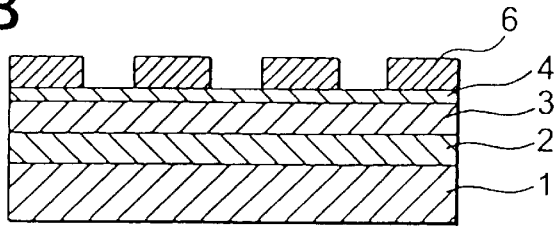
FIG. 12B is a sectional diagram taken along line B–B' of FIG. 9 to show fabricating steps for a conventional semiconductor device.
Figure 12C:
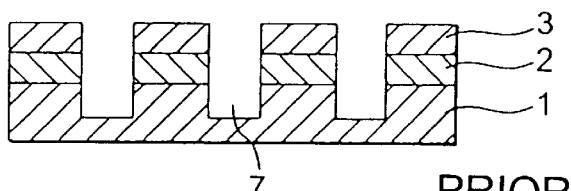
FIG. 12C is a sectional diagram taken along line B–B' of FIG. 9 to show fabricating steps for a conventional semiconductor device.
Figure 12D:
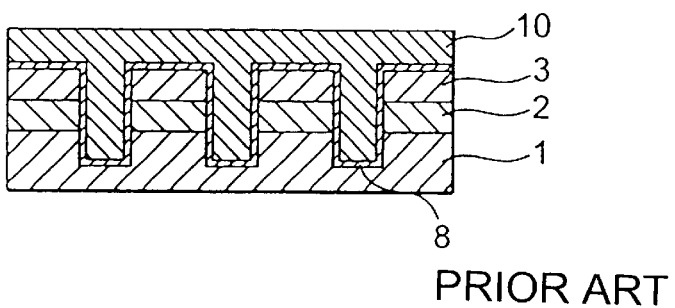
FIG. 12D is a sectional diagram taken along line B–B' of FIG. 9 to show fabricating steps for a conventional semiconductor device.
Figure 13:
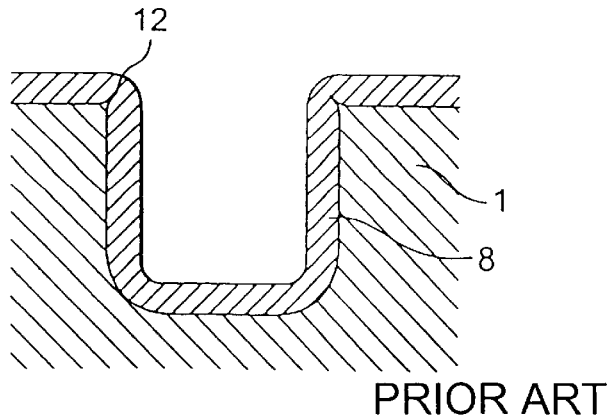
FIG. 13 is an enlarged sectional diagram showing a trench of a conventional semiconductor device.

FIGS. 7A and 7B show modified embodiments of the invention in which the invention is applied to an IGBT type semiconductor device. FIG. 7A shows NPT-IGBT, and FIG. 7B shows PT-IGBT. They are the same to the one shown in Embodiment 1 through 3 except that FIG. 7A uses a n/p$^+$ substrate and FIG. 7B uses a n/n$^+$/p$^+$ substrate.

What is claimed is:

1. A semiconductor device, comprising:
    a semiconductor substrate;
    a diffusion layer containing a high concentration of impurity formed on a surface of the semiconductor substrate;
    an insulation film formed on the diffusion layer;
    a layer which is formed on the insulation film and has an oxidation rate faster than the semiconductor substrate and the diffusion layer;
    trenches formed to pierce the diffusion layer, the insulation film and the layer having a fast oxidation rate; and
    an oxidation film formed to cover a sidewall of the trenches;
    wherein at least an upper end corner portion of the sidewall of each of the trenches is covered with an oxidation film which is formed by oxidizing the layer having the fast oxidation rate.

2. The semiconductor device according to claim 1, wherein the layer having the fast oxidation rate is substantially made of polysilicon.

3. The semiconductor device according to claim 2, wherein impurities are added to the polysilicon.

* * * * *